US009063392B2

(12) United States Patent
Okuda

(10) Patent No.: US 9,063,392 B2
(45) Date of Patent: Jun. 23, 2015

(54) IMAGING UNIT

(75) Inventor: Isao Okuda, Saitama (JP)

(73) Assignee: HOYA CORPORATION, Tokyo (JP)

( * ) Notice: Subject to any disclaimer, the term of this patent is extended or adjusted under 35 U.S.C. 154(b) by 314 days.

(21) Appl. No.: 13/552,742

(22) Filed: Jul. 19, 2012

(65) Prior Publication Data

US 2013/0026344 A1    Jan. 31, 2013

(30) Foreign Application Priority Data

Jul. 28, 2011   (JP) .................................. 2011-165137

(51) Int. Cl.
| | |
|---|---|
| *H01L 27/00* | (2006.01) |
| *G03B 17/02* | (2006.01) |
| *H04N 5/225* | (2006.01) |
| *H01L 27/146* | (2006.01) |
| *G03B 17/17* | (2006.01) |

(52) U.S. Cl.
CPC .............. *G03B 17/02* (2013.01); *H04N 5/2252* (2013.01); *H01L 27/14625* (2013.01); *G03B 17/17* (2013.01)

(58) Field of Classification Search
CPC   H01L 27/146; H01L 27/14625; H04N 5/225; H04N 5/2252
USPC ............... 250/208.1, 216, 239; 348/337, 340; 396/79, 529, 535
See application file for complete search history.

(56) References Cited

U.S. PATENT DOCUMENTS

| | | | |
|---|---|---|---|
| 8,120,693 B2 | 2/2012 | Nomura et al. | |
| 2007/0009244 A1* | 1/2007 | Takahashi | .................... 396/55 |
| 2009/0051804 A1* | 2/2009 | Nomura et al. | ................ 348/344 |
| 2012/0075518 A1 | 3/2012 | Okuda | |
| 2012/0075728 A1 | 3/2012 | Takakubo et al. | |
| 2012/0081797 A1 | 4/2012 | Saori et al. | |

FOREIGN PATENT DOCUMENTS

| | | |
|---|---|---|
| JP | 09-211287 | 8/1997 |
| JP | 2004-247887 | 9/2004 |
| JP | 2006-222473 | 8/2006 |
| JP | 2006-227234 | 8/2006 |
| JP | 2010-26007 | 2/2010 |

OTHER PUBLICATIONS

Japan Office action, dated Mar. 3, 2015 along with an English translation thereof.

* cited by examiner

*Primary Examiner* — Kevin Pyo
(74) *Attorney, Agent, or Firm* — Greenblum & Bernstein P.L.C.

(57) ABSTRACT

An imaging unit includes an image sensor, an imaging optical system which includes a prism that is positioned on the object side of the image sensor, wherein the prism bends an optical path of light emanating from an object to lead the light to the image sensor; a housing which accommodates and supports the image sensor and the prism; a light shield frame, which forms a part of the housing, provided on the object side of an incident surface of the prism, wherein the light shield frame shields a part of the light incident on the incident surface of the prism; and a prism positioning surface which is formed on the housing and contacts the prism to position the prism with respect to the housing.

13 Claims, 6 Drawing Sheets

IMAGING UNIT

BACKGROUND OF THE INVENTION

1. Field of the Invention

The present invention relates to an imaging unit having an imaging optical system and an image sensor.

2. Description of the Related Art

In recent years, mobile electronic devices which are designed mainly for taking still/moving photographic images, such as digital cameras (still-video cameras) and digital camcorders (motion-video cameras), and other mobile electronic devices which are designed to have the capability of taking such photographic images as a subsidiary function, such as mobile phones equipped with a camera and personal digital assistants (PDAs) equipped with a camera, have become widespread. In these types of mobile electronic devices, it is common to provide the mobile electronic device therein with an imaging unit which is structured such that an image sensor and a photographing optical system, for leading light emanating from a photographic object (object to be photographed) to the image sensor, are accommodated in a hollow housing of the imaging unit.

In this type of imaging unit, it is sometimes the case that a prism which bends an optical path to lead this optical path to the image sensor is installed immediately in front of the image sensor (on the object side). Additionally, in recent years, the downsizing (slimming down) of the imaging unit has progressed, following the progress of the downsizing (slimming down) of the mobile electronic devices, and accordingly, if a prism is used as an element of this type of imaging unit, this prism needs to be miniaturized.

However, if the prism is miniaturized, stray light occurs by reflections caused by side surfaces of the prism, which increases the possibility of such stray light reaching the imaging surface of the image sensor. Therefore, in the case where a small prism is used, a light shield frame for preventing part of the light emanating from a photographic object from traveling toward the side surfaces of the prism needs to be provided on the incident surface side of the prism.

Japanese Unexamined Patent Publication No. 2010-026007 discloses a light shield frame that is provided on the incident surface of a prism.

Whereas, since the aforementioned prism has been miniaturized as described above and also since it is ideal to make the space in the imaging unit which is occupied by the aforementioned light shield frame as small as possible, the light shield frame needs to be miniaturized to produce a slimmed-down imaging unit.

A light shield sheet which can adhere to the incident surface of the prism is known in the art as an example of the light shield frame which is small in size.

However, since it is difficult to adhere a thin and small light shield sheet to the incident surface of the small prism, there is a possibility of the position of adhering the light shield sheet to the incident surface of the prism deviating from a desired position, which may consequently cause stray light to reach the imaging surface of the image sensor.

SUMMARY OF THE INVENTION

The present invention provides an imaging unit which is configured so that a small light shield frame can be easily installed with high positional precision on the incident surface side of a prism that is positioned on the object side of an image sensor even when the prism is miniaturized.

According to an aspect of the present invention, an imaging unit is provided, including an image sensor; an imaging optical system which includes a prism that is positioned on the object side of the image sensor, wherein the prism bends an optical path of light emanating from an object to lead the light to the image sensor; a housing which accommodates and supports the image sensor and the prism; a light shield frame, which forms a part of the housing, provided on the object side of an incident surface of the prism, wherein the light shield frame shields a part of the light incident on the incident surface of the prism; and a prism positioning surface which is formed on the housing and contacts the prism to position the prism with respect to the housing.

It is desirable for the imaging optical system to include an incident-side prism which is positioned closer to the object than the prism and bends the optical path to lead the light to the prism.

It is desirable for the imaging unit to include a cover glass which covers an imaging surface of the image sensor, and an image-sensor positioning surface which is formed on the housing and contacts the cover glass to position the image sensor with respect to the housing.

It is desirable for a plurality of the image-sensor positioning surfaces to lie on a common plane.

It is desirable for the prism positioning surface to include an inclined flat surface which is in contact with a flat reflecting surface that is formed on the prism to bend the optical path, wherein the inclined flat surface is inclined with respect to both an optical path of the light incident on the flat reflecting surface and an optical path of the light reflected by the flat reflecting surface; and an incident-side contact surface which contacts an outer edge of the incident surface of the prism and is orthogonal to the optical path of the light incident on the flat reflecting surface.

It is desirable for a plurality of the inclined flat surfaces to lie on a common plane.

It is desirable for the housing to include a frame member which faces the incident surface of the prism, and wherein the frame member includes a base portion which extends in a direction orthogonal to both the optical path of the light incident on the flat reflecting surface and the optical path of the light reflected by the flat reflecting surface and which is formed integrally with an inner surface of the housing; a pair of side portions which extend from both ends of the base portion in a direction parallel to the optical path of the light reflected by the flat reflecting surface; and a connecting portion which is parallel to the base portion and connects common ends of the pair of side portions. The light shield frame is formed on inner edges of the base portion, the pair of side portions and the connecting portion. The incident-side contact portion is formed on the frame member except on the connecting portion of the frame member.

According to the present invention, since the light shield frame is integrally configured on a part of the housing and also since the positioning of the prism with respect to the housing is achieved by the prism positioning surface that is formed on the housing, the light shield frame can be installed on the incident surface side of the prism with great positional precision even in the case where the prism and the light shield frame are miniaturized.

Moreover, the operation to install the light shield frame to the prism or the housing is not required since the light shield frame is formed integrally with the housing. Therefore, the light shield frame can be easily positioned on the incident surface side of the prism since the operation to position the light shield frame on the incident surface side of the prism only requires the prism to be brought into contact with the prism positioning surface.

The present disclosure relates to subject matter contained in Japanese Patent Application No. 2011-165137 (filed on Jul. 28, 2011) which is expressly incorporated herein by reference in its entirety.

BRIEF DESCRIPTION OF THE DRAWINGS

The present invention will be described below in detail with reference to the accompanying drawings in which.

DESCRIPTION OF THE PREFERRED EMBODIMENT

Figure 1:
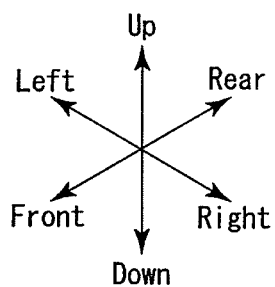
FIG. 1 is a front perspective view of an embodiment of an imaging unit, according to the present invention, that is equipped with a lens unit, viewed obliquely from above.
Figure 1:
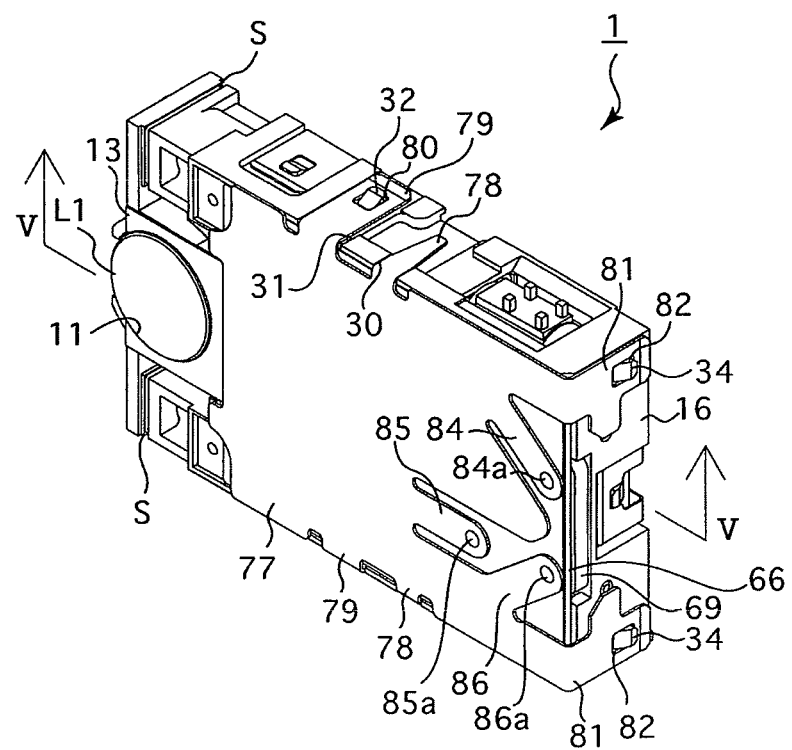

An embodiment of an imaging unit according to the present invention will be hereinafter discussed with reference to the accompanying drawings. In the following descriptions, forward and rearward directions, leftward and rightward directions, and upward and downward directions are determined with reference to the directions of the double-headed arrows shown in the drawings.

Figure 2:
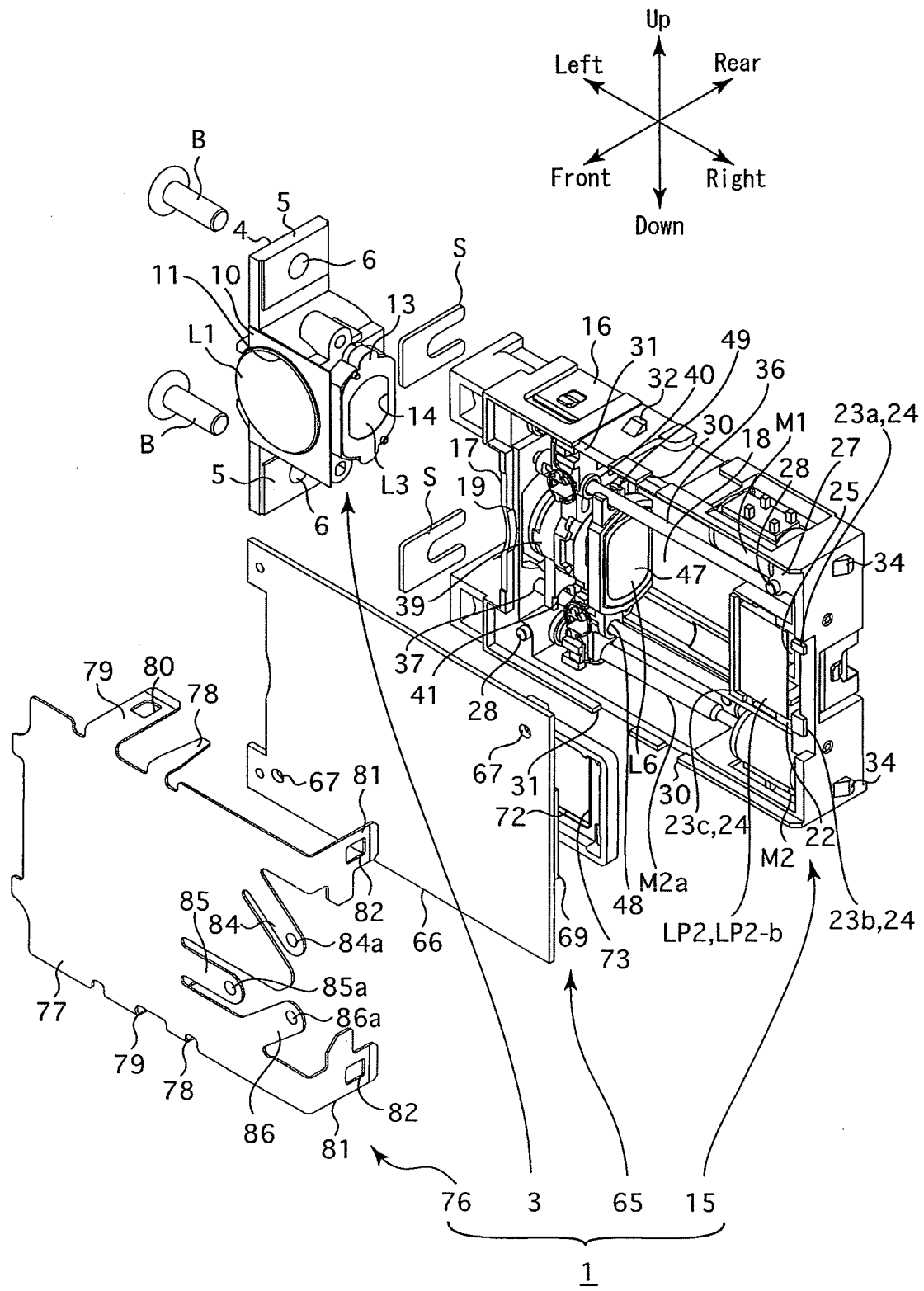
FIG. 2 is a front exploded perspective view of the imaging unit, viewed obliquely from above.

As shown in FIGS. 1 and 2, the imaging unit 1 is provided with a first lens group unit 3, a body module 15, a board module 65 and a cover 76 that constitute the major components of the imaging unit 1.

Figure 5:
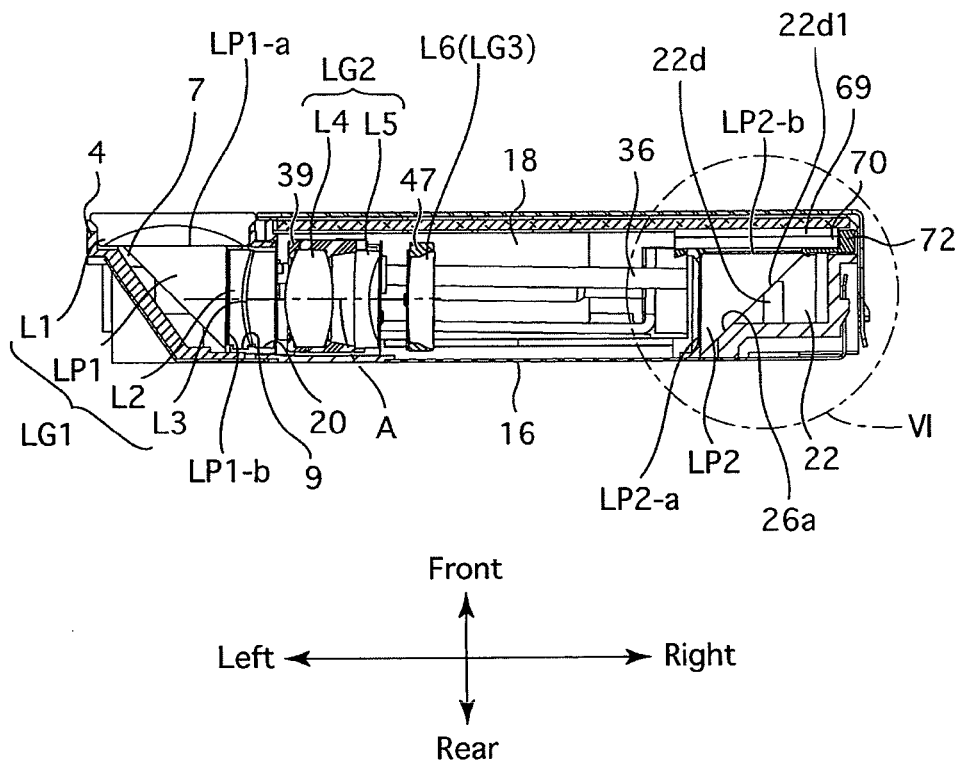
FIG. 5 is a cross sectional view taken along the line V-V shown in FIG. 1 when the imaging optical system is set at the telephoto extremity.

The first lens group unit 3 is provided with a holder 4 that is formed as a synthetic-resin molded product. The holder 4 is provided at the left end thereof with a pair of (upper and lower) lugs 5, each of which has a through-hole 6. As shown in FIG. 5, a prism accommodating space 7 which is open at the front and right sides is formed in the holder 4. The holder 4 is provided at the front opening of the prism accommodating space 7 with a front lens holding hole (lens holding hole) 8 which is open at a left portion thereof, and is provided at the right opening of the prism accommodating space 7 with a right lens holding hole 9 which is noncircular in shape and open at the upper and lower ends thereof. As shown in FIG. 5 and other drawings, the first lens group unit 3 is provided with a first prism (prism) LP1 which is fit-engaged into the prism accommodating space 7 and fixed thereto. The first prism LP1 is provided with a rectangular incident surface LP1-$a$, which is orthogonal to the forward/rearward direction and elongated in the upward/downward direction, and a rectangular exit surface LP1-$b$ which is orthogonal to the leftward/rightward direction and elongated in the upward/downward direction. The first lens group unit 3 is provided in the front lens holding hole 8 with a lens element (circular lens element) L1 which has a circular outer shape and the optical axis of which extends in the forward/rearward direction. The lens element L1 is fitted into the front lens holding hole 8 and fixed thereto so as to face the incident surface LP1-$a$ in the forward/rearward direction.

Figure 3:
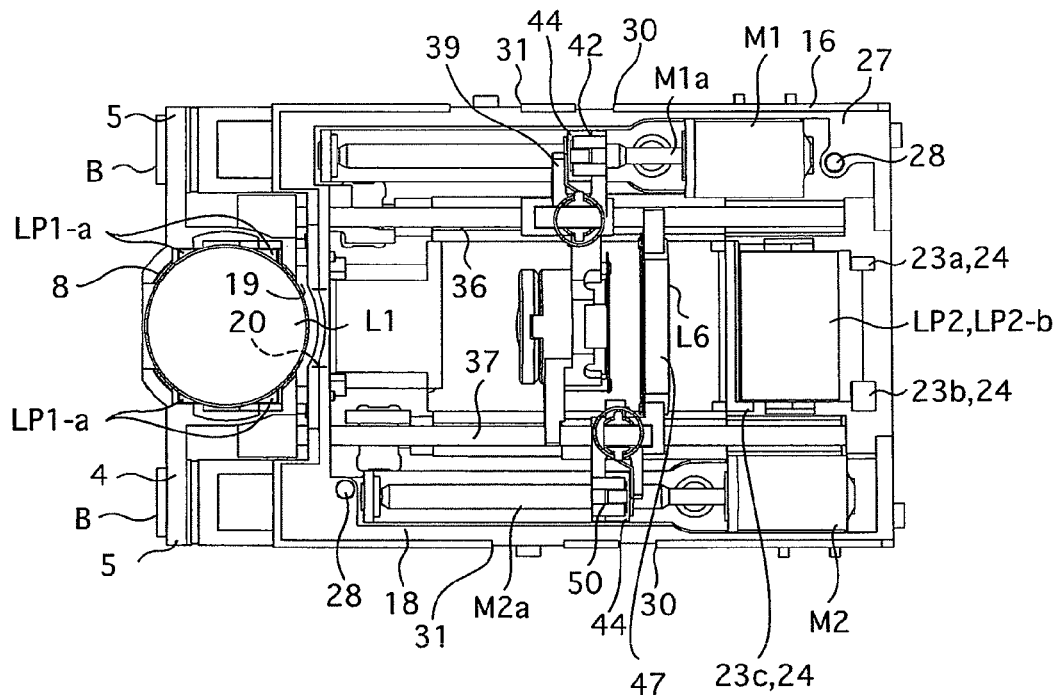
FIG. 3 is a front elevational view of the imaging unit with a cover and a circuit board removed when an imaging optical system is set at the wide-angle extremity.
Figure 4:
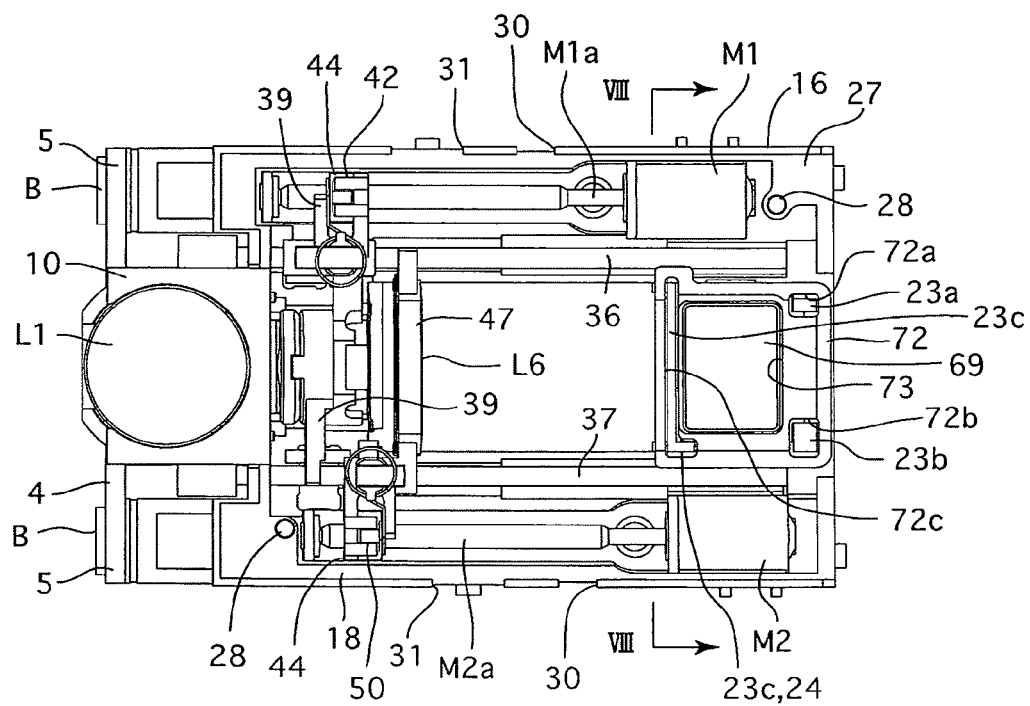
FIG. 4 is a view similar to that of FIG. 3, showing the imaging unit with the cover and the circuit board removed when the imaging optical system is set at the telephoto extremity.

When the first lens group unit 3 is viewed from the front as shown in FIG. 3, the four corners of the incident surface LP1-$a$ of the first prism LP1 are positioned radially outside the lens element L1. However, as shown in FIGS. 2 and 4, a front light shield mask (light shield member) 10 is fixedly adhered to a front surface (mask fixing surface) of the holder 4. The front light shield mask 10 is provided with a lens opening 11 which is formed to avoid interference with the lens element L1. The four corners of the incident surface LP1-$a$ are covered by the four corners of the front light shield mask 10, respectively, thus not being exposed to the front.

The first lens group unit 3 is provided with two plastic lens elements (lens elements) L2 and L3 which are fixedly fitted into the right lens holding hole 9 in a state of being cemented to each other (see FIG. 5).

In addition, a right light shield mask 13 is fixedly adhered to a right end surface of the holder 4 to cover a right side surface of the lens element L3 (see FIG. 2). However, an opening 14 (see FIG. 2) is formed in the right light shield mask 13, and accordingly, a radially inner part of the lens element L3 that is radially inside the outer edge of the lens element L3 is exposed to the right side.

The lens element L1, the first prism LP1, the lens element L2 and the lens element L3 that have been described above are elements of a first lens group LG1. In addition, the holder 4, the front light shield mask 10, the first lens group LG1 and the right light shield mask 13 are elements of the first lens group unit 3.

The body module 15 is provided with a housing (casing) 16 made of synthetic resin. The housing 16 is provided at the left end thereof with a mounting recess 17. In addition, the housing 16 is provided, on the front of a portion thereof which is positioned on the right-hand side of the mounting recess 17, with an accommodating recess 18 which is substantially rectangular in cross section. The housing 16 is provided between the mounting recess 17 and the accommodating recess 18 with a partition wall 19 which separates the mounting recess 17 and the accommodating recess 18 from each other. The housing 16 is provided at a center of the partition wall 19 with a communication hole (through-hole) 20 (see FIG. 3) via which the mounting recess 17 and the accommodating recess 18 are communicatively connected with each other. The housing 16 is provided, in the accommodating recess 18 at the right end thereof, with a positioning portion 22 having a substantially rectangular shape, in a front view, which projects forward from the base of the accommodating recess 18. The positioning portion 22 is provided with three positioning spacers 23$a$, 23$b$ and 23$c$ which project forward, and the front end surfaces of the three spacers 23$a$, 23$b$ and 23$c$ are formed as flat positioning surfaces (image-sensor positioning surfaces) 24 which lie on a common plane orthogonal to the forward/rearward direction (i.e., the direction of the thickness of the housing 16). In addition, the housing 16 is provided in the positioning portion 22 with a prism mounting recess 25 which is open at the front and left sides.

Figure 6:
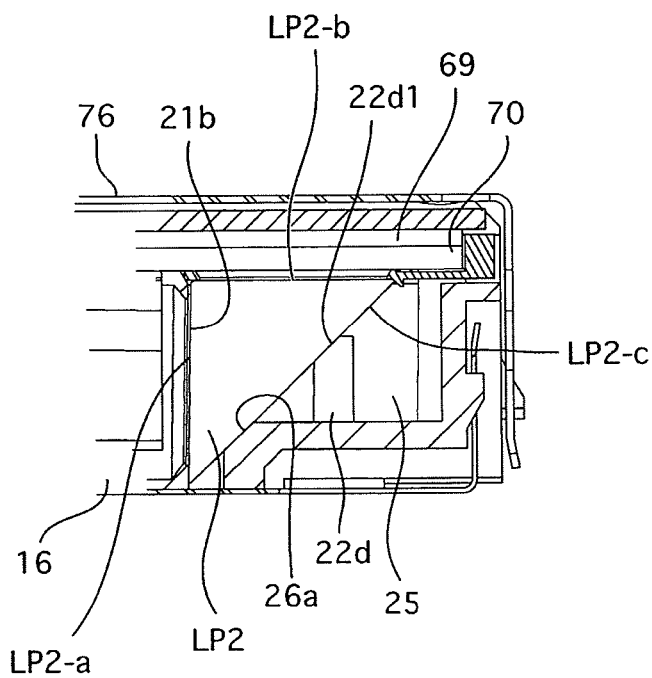
FIG. 6 is an enlarged view of a portion of the cross sectional view shown in FIG. 5 which is surrounded by a single-dot chain line VI.
Figure 7:
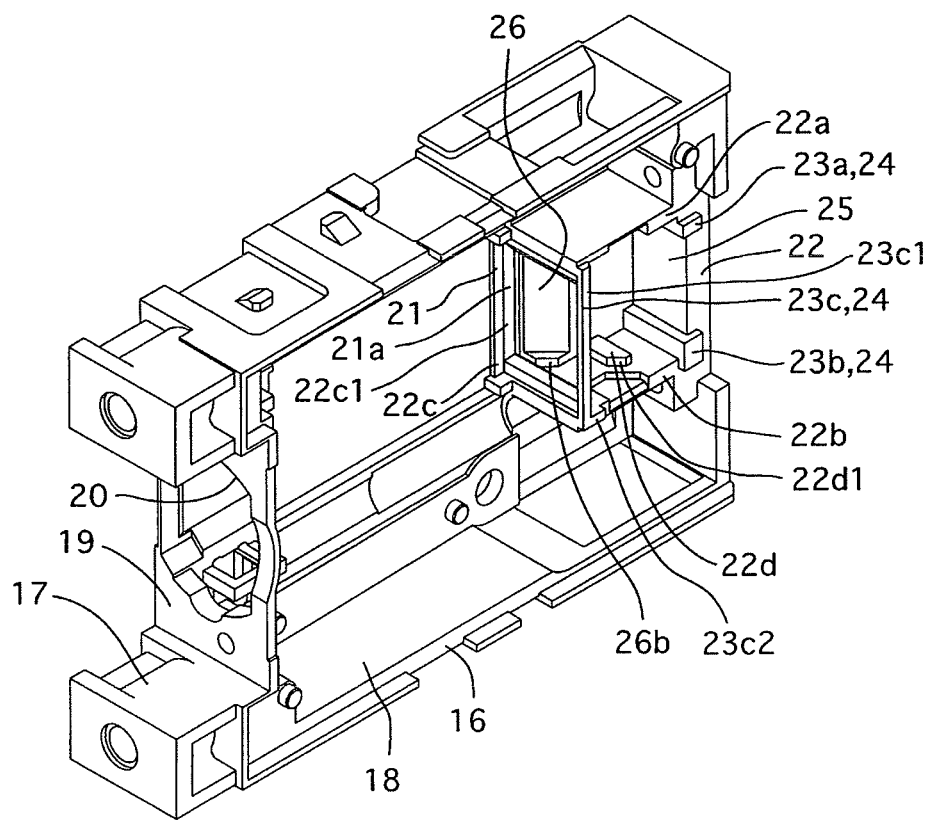
FIG. 7 is a perspective view of a housing that constitute a component of the imaging unit.
Figure 8:
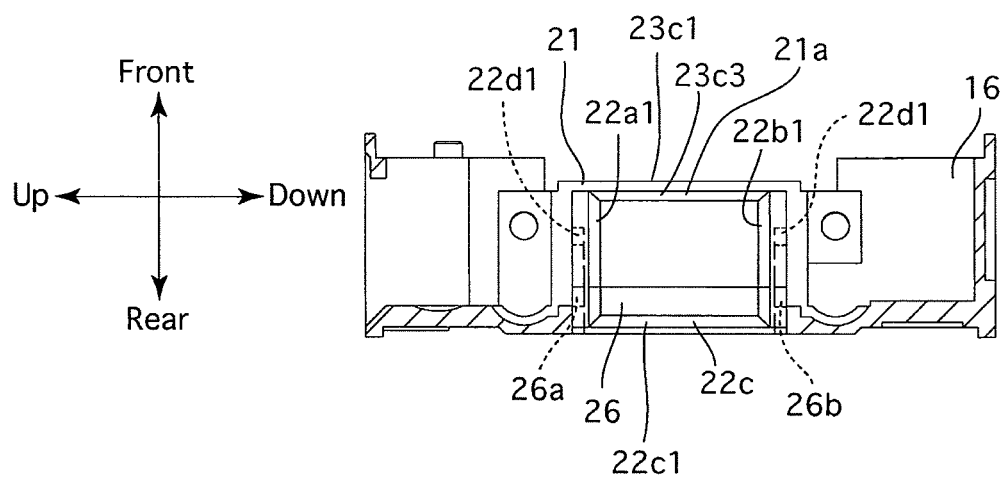
FIG. 8 is a cross sectional view taken along the line VIII-VIII shown in FIG. 4.

The spacer 23c is provided with a connecting portion 23c1 which extends in the upward/downward direction and a bent end portion 23c2 which extends rightward from the lower end of the connecting portion 23c1 (see FIG. 7). The connecting portion 23c1 connects the front ends (common ends) of upper and lower walls (side portions) 22a and 22b to each other, both of which project forward from the base of the accommodating recess 18 (both of which are integral with the base of the accommodating recess 18). The housing 16 is provided on the base of the accommodating recess 18 with a base portion 22c which connects the left ends of the upper wall 22a and the lower wall 22b to each other and which extends in the upward/downward direction. The upper wall 22a, the lower wall 22b, the base portion 22c and the connecting portion 23c1 constitute a frame member 21 that has a rectangular shape elongated in the upward/downward direction in a side view (see FIG. 7). Light shield portions 22a1, 22b1, 22c1 and 23c3 are formed integrally with the inner edges of the upper wall 22a, the lower wall 22b, the base portion 22c and the connecting portion 23c1 as parts of the housing 16, respectively (see FIG. 8). In addition, the light shield portions 22a1, 22b1, 22c1 and 23c3 constitute a light shield frame 21a in the shape of a rectangle elongated in the upward/downward direction in a side view. The right sides of the light shield portions 22a1, 22b1 and 22c1 (i.e., the right side of the light shield frame 21a except the light shield portion 23c3 thereof) form an incident-side contact surface 21b (see FIG. 6) that is formed as a flat surface orthogonal to the leftward/rightward direction. A prism support portion 26 is projected from the base of the accommodating recess 18 in the prism mounting recess 25. The prism support portion 26 is positioned on the right-hand side of the light shield frame 21a. The prism support portion 26 is provided on the front thereof with a right and left pair of inclined flat surfaces (prism positioning surfaces) 26a and 26b which are formed to be inclined at an angle of 45 degrees with respect to both a straight line extending in the forward/rearward direction and a straight line extending in the leftward/rightward direction. In addition, each of the upper wall 22a and the lower wall 22b is provided on the inner surface thereof with an inner wall projection 22d, respectively, and each of these inner wall projections 22d is provided on a front surface thereof with an inclined flat surface (prism positioning surface) 22d1 which lies on a plane on which the inclined flat surfaces 26a and 26b lie (see FIG. 8). Accordingly, the inclined flat surfaces 22d1 and the inclined flat surfaces 26a and 26b lie on a common plane.

The housing 16 is further provided, around the front edge of the inner peripheral surface of the accommodating recess 18, with a board support surface 27 which is positioned one step behind the frontmost end of the housing 16 and lies on a plane orthogonal to the forward/rearward direction, and is further provided on the board support surface 27 with two lock projections 28 which project forward from the board support surface 27. The housing 16 is provided, at the front end of the center of the upper surface of the housing 16, with a first engaging recess 30 which is recessed one step downward from the upper surface (periphery) of the housing 16. The housing 16 is also provided, at the front end of the upper surface of the housing 16 on the left-hand side of the first engaging recess 30 at the same vertical position as the first engaging recess 30, with a second engaging recess 31 which is recessed downward from the upper surface (periphery) of the housing 16 by the same amount as the first engaging recess 30 and is wider than the first engaging recess 30. The housing 16 is provided in the second engaging recess 31 with an engaging projection 32. The housing 16 is also provided on the lower surface thereof with a first engaging recess 30, a second engaging recess 31 and an engaging projection 32 which have the same configurations as those provided on the upper surface of the housing 16 (see FIGS. 3 and 4). The positional relationship between the first engaging recess 30, the second engaging recess 31 and the engaging projection 32 which are formed on the lower surface of housing 16 is identical to the positional relationship between the first engaging recess 30, the second engaging recess 31 and the engaging projection 32 which are formed on the upper surface of housing 16; however, the positions of the first engaging recess 30, the second engaging recess 31 and the engaging projection 32 in the leftward/rightward direction which are formed on the lower surface of the housing 16 are each shifted to the right with respect to those formed on the upper surface of the housing 16. Additionally, the housing 16 is provided on the right side thereof with a pair of (upper and lower) engaging projections 34 (see FIGS. 1 and 2).

Figure 9:
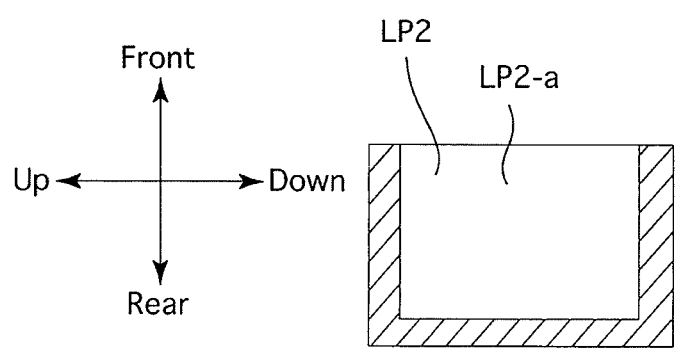
FIG. 9 is a cross sectional view showing the incident surface of the second prism shown in FIGS. 2, 3, 5 and 6.

The body module 15 is provided with a second prism (prism) LP2 that is fit-engaged in the prism mounting recess 25 of the housing 16 and fixed thereto. The second prism LP2 has an incident surface LP2-a which is orthogonal to the leftward/rightward direction and an exit surface LP2-b which is orthogonal to the forward/rearward direction. More specifically, the second prism LP2 is fixed to the two inner wall projections 22d, the prism support portion 26 and the light shield frame 21a by bringing the upper edge of a flat reflecting surface LP2-c (see FIG. 6) of the second prism LP2 into surface contact with the upper inclined flat surfaces 22d1, 26a and 26b, bringing the lower edge of the flat reflecting surface LP2-c of the second prism LP2 into surface contact with the lower inclined flat surfaces 22d1, 26a and 26b, and bringing the upper, lower and rear edges of the incident surface LP2-a into surface contact with the incident-side contact surface 21b (the hatched portion shown in FIG. 9 shows a portion of the incident surface LP2-a which is brought into contact with the incident-side contact surface 21b). The flat reflecting surface LP2-c of the second prism LP2 constitutes the right end surface of the second prism LP2 and is inclined to both the incident surface LP2-a and the exit surface LP2-b at an angle of 45 degrees. Upon the second prism LP2 being fitted into the prism mounting recess 25 and fixed thereto, the light shield frame 21a covers the entire peripheral edge of the incident surface LP2-a as viewed from the left, a clearance is created between the front edge of the incident surface LP2-a and a right side of the connecting portion 23c1, and the incident surface LP2-a faces the exit surface LP1-b in the leftward/rightward direction.

The body module 15 is provided with a first rod (cylindrical rod) 36 and a second rod (cylindrical rod) 37 which are made of metal and extend linearly in the leftward/rightward direction. The first rod 36 and the second rod 37 are each fixed at both ends thereof to an inner surface of the right side wall of the housing 16 and the partition wall 19 so that the left ends of the first rod 36 and the second rod 37 are aligned in the upward/downward direction and so that the right ends of the first rod 36 and the second rod 37 are aligned in the upward/downward direction.

The body module 15 is provided with a second lens group frame 39 made of synthetic resin. An insertion hole 40 in which the first rod 36 is inserted is formed through the upper part of the second lens group frame 39, and a rotation prevention groove 41 in which the second rod 37 is engaged is formed in the lower end of the second lens group frame 39. The second lens group frame 39 is prevented from rotating about the first rod 36 by the engagement of the rotation prevention groove 41 with the second rod 37, and accordingly, the second lens group frame 39 can slide on and along the first rod 36 and the second rod 37 in the leftward/rightward direction. The body module 15 is provided with a second lens group (image-side lens) LG2 configured of two lens elements L4 and L5, which are each supported by the second lens group frame 39 and which are adjacent to the exit surface LP1-b of the first prism LP1 and the incident surface LP2-a of the second prism LP2 in the leftward/rightward direction, respectively. In addition, a nut holding hole 42, both ends of which in the leftward/rightward direction are formed as open ends, is formed at the upper end of the second lens group frame 39, and a driven nut (upper driven nut) 44, through which a female screw hole with the axis thereof extending in the leftward/rightward direction is formed, is fixedly fitted into the nut holding hole 42 in such a manner so as to be prevented from rotating about the axis of the aforementioned female screw hole. The body module 15 is provided with a first motor (stepping motor) M1 which is fixed to the housing 16 in the upper part of the accommodating recess 18. The first motor M1 is provided with a rotary drive shaft M1a which extends linearly leftwards, and a male screw thread formed on the rotary drive shaft M1a in the vicinity of the end (left end with respect to FIGS. 3 and 4) thereof is screw-engaged with the aforementioned female screw hole of the upper driven nut 44. Accordingly, forward and reverse rotations of the rotary drive shaft M1a that are caused by forward and reverse rotations of the first motor M1 cause the second lens group frame 39 (the lens elements L4 and L5) to move linearly between the telephoto extremity position (shown in FIG. 4) and the wide-angle extremity position (shown in FIG. 3) in the leftward/rightward direction along the first rod 36 and the second rod 37.

In addition, the body module 15 is provided with a third lens group frame 47 made of synthetic resin. An insertion hole 48 in which the second rod 37 is inserted is formed through the lower part of the third lens group frame 47, and a rotation prevention groove 49 in which the first rod 36 is engaged is formed in the upper end of the third lens group frame 47. Accordingly, the third lens group frame 47 can slide on and along the first rod 36 and the second rod 37 in the leftward/rightward direction (while being prevented from rotating about the second rod 37). The body module 15 is provided with a third lens group (image-side lens) LG3 configured of a lens element L6, the optical axis thereof being coaxial with the optical axis of the second lens group LG2. The third lens group LG3 is fixedly fitted into a lens holding hole which is formed through the third lens group frame 47 in the leftward/rightward direction. A nut holding hole 50, both ends of which in the leftward/rightward direction are formed as open ends, is formed at the lower end of the third lens group frame 47, and a driven nut (lower driven nut) 44, through which a female screw hole with the axis thereof extending in the leftward/rightward direction is formed, is fixedly fitted into the nut holding hole 50 in such a manner so as to be prevented from rotating about the axis of the driven nut 44 that extends in the leftward/rightward direction.

The body module 15 is provided with a second motor M2 which is identical in specifications to the first motor M1 and fixed to the housing 16 in the lower part of the accommodating recess 18. The second motor M2 is provided with a rotary drive shaft M2a (identical in specifications to the rotary drive shaft M1a), and a male screw thread formed on the rotary drive shaft M2a in the vicinity of the end (left end with respect to FIGS. 3 and 4) is screw-engaged with the aforementioned female screw hole of the lower driven nut 44. Therefore, forward and reverse rotations of the rotary drive shaft M2a that are caused by forward and reverse rotations of the second motor M2 cause the third lens group frame 47 (the third lens group LG3) to move linearly between the telephoto extremity position (shown in FIG. 4) and the wide-angle extremity position (shown in FIG. 3) in the leftward/rightward direction along the first rod 36 and the second rod 37.

The housing 16, the first rod 36, the second rod 37, the second lens group LG2 (the second lens group frame 39 and the driven nut 44), the third lens group LG3 (the third lens group frame 47 and the driven nut 44), the second prism LP2, the first motor M1 and the second motor M2 are components of the body module 15.

The first lens group unit 3 and the body module 15 are fixed together as one unit by inserting a pair of set screws B from the left side into the through-holes 6 of the upper and lower lugs 5 of the holder 4 and screwing the male thread portions of the pair of set screws B into a pair of female screw holes (not shown) formed in upper and lower left end surfaces of the housing 16 with a portion of the holder 4 which is positioned on the right-hand side of the upper and lower lugs 5 being fitted into the mounting recess 17 and with a pair of (upper and lower) spacers S held between the upper and lower lugs 5 of the holder 4 and the upper and lower left end surfaces of the housing 16 (that are the left end surfaces of a pair of projections of the housing 16 which are formed on the vertically opposite sides of the mounting recess 17).

Upon the first lens group unit 3 and the body module 15 being fixed together as one unit, the right end of the holder 4 (in which the right lens holding hole 9 is formed) is fitted into the communication hole 20 of the partition wall 19 of the housing 16, and the optical axis A of the lens elements L2 and L3 aligns with the optical axis of the second lens group LG2 and the third lens group LG3.

The first lens group LG1 (L1, LP1, L2 and L3), the second lens group LG2 (L4 and L5), the third lens group LG3 (L6) and the second prism LP2 that have been described above are optical elements of an imaging optical system (bending optical system). A zooming operation is performed by moving the second lens group LG2 (the lens elements L4 and L5) and the third lens group LG3 (the lens L6) along the first rod 36 and the second rod 37, and a focusing operation is performed by moving only the third lens group LG3 along the first rod 36 and the second rod 37.

The board module 65 is provided with a circuit board 66. The circuit board 66 has substantially the same (namely, corresponds to) front shape as the shape of the accommodating recess 18 of the housing 16 and is configured from a flat plate orthogonal to the forward/rearward direction. The circuit board 66 is provided on the rear surface thereof with a printed circuit (not shown), and two circular holes 67 are formed through two diagonally opposite corners of the circuit board 66, respectively.

The board module 65 is provided with an image sensor (image pickup device) 69 (see FIGS. 1, 2 and 5) which is fixed at the right end of the rear surface of the circuit board 66. A plurality of terminals (not shown) of the image sensor 69 are fixedly connected to the aforementioned printed circuit by soldering. The image sensor 69 is provided on the rear thereof with an imaging surface (not shown) that is orthogonal to the forward/rearward direction. In addition, the image sensor 69 is provided, on the incident surface (the rear surface in the drawings) thereof, with a cover glass 70 which is made of a flat glass plate and fixedly installed so as to cover the entire imaging surface of the image sensor 69.

A rear surface (rear end) of the image sensor 69 is covered with a packing 72 made of an elastic material such as rubber which is open at the front and left sides. The packing 72 is provided in the rear surface thereof with an exposing hole (through-hole) 73, through which the entire imaging surface of the image sensor 69 is rearwardly exposed, and is further provided in the rear surface thereof with three through-holes 72*a*, 72*b* and 72*c* which allow the three positioning spacers 23*a*, 23*b* and 23*c* to penetrate and project forward therethrough, respectively.

The circuit board 66, the image sensor 69 and the packing 72 that have been described above are components of the board module 65.

The cover 76 is a press-molded sheet metal product and is integrally provided with a base 77, two (upper and lower) short engaging lugs 78, two (upper and lower) long engaging lugs (resilient engaging lug) 79 and a pair of (upper and lower) side engaging lugs (resilient engaging lugs) 81. The base 77 is formed as a planar member orthogonal to the forward/rearward direction. The upper short engaging lug 78 and the upper long engaging lug 79 extend rearward from the upper edge of the base 77, and the lower short engaging lug 78 and the lower long engaging lug 79 extend rearward from the lower edge of the base 77. The pair of side engaging lugs 81 extend rearward from the right edge of the base 77. Each side engaging lug 81 is in the shape of a letter T as viewed from a side thereof. The base 77 is slightly greater in size (dimensions) than the circuit board 66 and has a substantially rectangular shape. The base 77 is provided with three pressure leaves 84, 85 and 86, each of which is resiliently deformable in the forward/rearward direction.

The pressure leaves 84, 85 and 86 are provided with pressure projections 84*a*, 85*a* and 86*a*, respectively, which project rearwardly (portions of the front surfaces of the pressure leaves 84, 85 and 86 which respectively correspond to the pressure projections 84*a*, 85*a* and 86*a* are dented (recessed) rearward). The pressure leaves 84, 85 and 86 in a free state lie on a plane on which the remaining part of the base 77 lies.

An engaging hole 80 and an engaging hole 82 are formed through each long engaging lug 79 and each side engaging lug 81, respectively.

To install the board module 65 and the cover 76 to the body module 15, first the front opening of the accommodating recess 18 is closed by the circuit board 66 so that the outer edge of the rear surface of the circuit board 66 comes into surface contact with the board support surface 27 while the two circular holes 67 of the circuit board 66 are brought into engagement with the two lock projections 28 (thereupon, the front surface of the circuit board 66 and the front surface of the housing 16 substantially lie on a common plane). Thereupon, the three spacers 23*a*, 23*b* and 23*c* of the housing 16 forwardly pass through the three through-holes 72*a*, 72*b* and 72*c* of the packing 72 so that the flat positioning surfaces 24 of the three spacers 23*a*, 23*b* and 23*c* come in surface contact with a flat rear surface of the cover glass 70 (at the outer periphery of a rear surface portion immediately behind the imaging surface of the image sensor 69) to thereby create a clearance in the forward/rearward direction between the cover glass 70 and the second prism LP2 (the exit surface LP2-*b*). The imaging surface of the image sensor 69 faces the exit surface LP2-*b* of the second prism LP2 in the forward/rearward direction through the exposing hole 73. Furthermore, a rear surface of the packing 72 comes in contact with the front surface of the positioning portion 22.

Subsequently, the base 77 fully covers the front of the housing 16 to fix the cover 76 to the housing 16 by respectively engaging the upper and lower short engaging lugs 78 with the first engaging recesses 30, respectively engaging the upper and lower engaging holes 80 of the upper and lower long engaging lugs 79 with the upper and lower engaging projections 32, and respectively engaging the engaging holes 82 of the upper and lower side engaging lugs 81 with the upper and lower engaging projections 34.

Upon the imaging unit 1 being assembled in the above described manner, the circuit board 66 and the image sensor 69 are pressed rearward due to the pressure projections 84*a*, 85*a* and 86*a* of the pressure leaves 84, 85 and 86 coming in contact with a right-hand side portion of the front surface of the circuit board 66 so that a pressing force (biasing force) in the rearward direction acts on the front side of the circuit board 66 from the pressure leaves 84, 85 and 86 (via the pressure projections 84*a*, 85*a* and 86*a*) that are slightly resiliently deformed forwardly. Thereupon, an integral combination of the circuit board 66 and the image sensor 69 is held from the front and the rear sides thereof between the flat positioning surfaces 24 of the three spacers 23*a*, 23*b* and 23*c* and the pressure projections 84*a*, 85*a* and 86*a* of the cover 76, and accordingly, the circuit board 66 and the image sensor 69 are precisely positioned with respect to the housing 16 and the second prism LP2 in the forward/rearward direction by the three spacers 23*a*, 23*b* and 23*c* of the housing 16 and the pressure projections 84*a*, 85*a* and 86*a* of the cover 76.

If the imaging unit 1 is directed toward (pointed to) an object located in front of the imaging unit 1, light reflected by the object (light emanating from a photographic object) enters the first prism LP1 through the incident surface LP1-*a* after passing through the lens element L1 and is reflected at an angle of 90 degrees by an inner surface of the first prism LP1 to travel toward the exit surface LP-1*b*. Subsequently, the reflected light that emerges from the exit surface LP1-*b* enters the second prism LP2 from the incident surface LP2-*a* after passing through the lens elements L2 through L6, and is reflected at an angle of 90 degrees by the flat reflecting surface LP2-*c* of the second prism LP2 to travel toward the exit surface LP-2*b*. Subsequently, the reflected light that emerges from the exit surface LP2-*b* is captured (received) by the imaging surface of the image sensor 69 after passing through the exposing hole 73 and the cover glass 70. Even if an external force is exerted on the imaging unit 1 or vibrations occur in the imaging unit 1 as described above, the position of the image sensor 69 (the imaging surface thereof) in the forward/rearward direction is held precisely at a predetermined design position, and accordingly, a sharp object image with no blur can be captured by the image sensor 69 even if an external force is exerted on the imaging unit 1 or vibrations occur in the imaging unit 1.

Additionally, if the above described imaging optical system is driven to perform a zooming operation and a focusing operation by moving the second lens group LG2 (the lens elements L4 and L5) and the third lens group LG3 (the lens L6) along the first rod 36 and the second rod 37 with the first motor M1 and the second motor M2, an image capturing operation in a state where the imaging optical system is zoomed and focused on a photographic object image becomes possible.

In the above described embodiment of the imaging unit 1, the light shield frame 21*a* (the light shield portions 22*a*1, 22*b*1, 22*c*1 and 23*c*3) is positioned immediately on the lefthand side of the peripheral edge of the incident surface LP2-*a*, and accordingly, light which emanates from a photographic object and is passed through the first lens group LG1, the second lens group LG2 and the third lens group LG3 is partly shielded by the light shield frame 21*a*, so that the light which is passed through a through-hole formed through the inner side of the frame member 21 travels toward the incident surface LP2-*a* of the second prism LP2. On the other hand, part of the same light that emanates from a photographic object and is passed through the first through third lens group LG1, LG2 and LG3 can be effectively prevented from traveling toward both the upper and lower surfaces of the second prism LP2 by the light shield frame 21a, so that stray light which occurs by reflections caused by both the upper and lower sides of the second prism LP2 can be prevented from reaching the imaging surface of the image sensor 69.

Additionally, since the light shield frame 21a is formed integrally with part of the housing 16 and also since the positioning of the second prism LP2 with respect to the housing 16 is achieved by the incident-side contact surface 21b and the inclined flat surfaces 22d1, 26a and 26b, which are formed integrally with the housing 16, the light shield frame 21a can be installed on the incident surface LP2-a side of the second prism LP2 with great positional precision even when the second prism LP2 and the light shield frame 21a are miniaturized. Moreover, since the light shield frame 21a is formed integrally with the housing 16, an operation to install the light shield frame 21a to the housing 16 or the second prism LP2 is not required. Therefore, only an operation to bring the second prism LP2 into contact with the incident-side contact surface 21b and the inclined flat surfaces 22d1, 26a and 26b is required as an operation to position the light shield frame 21a on the incident surface LP2-a side of the second prism LP2, so that the light shield frame 21a can be easily positioned on the incident surface LP2-a side of the second prism LP2.

Furthermore, since the second prism LP2 is brought into surface contact with the incident-side contact surface 21b and the inclined flat surfaces 22d1, 26a and 26b while a clearance is formed between the front edge of the incident surface LP2-a and a right side of the connecting portion 23c1, the level of accuracy of the flatness and dimensional control over the connecting portion 23c1 of the spacer 23 can be relaxed.

Although the present invention has been described based on the above illustrated embodiment, various modifications to the above illustrated embodiment are possible.

For instance, either the inclined flat surfaces 26a and 26b or the inclined flat surface 22d1 can be omitted.

In addition, the first prism LP1 can be replaced by a mirror, or the first prism LP1 can be removed from the imaging optical system.

Obvious changes may be made in the specific embodiment of the present invention described herein, such modifications being within the spirit and scope of the invention claimed. It is indicated that all matter contained herein is illustrative and does not limit the scope of the present invention.

What is claimed is:

1. An imaging unit comprising:
   an image sensor;
   an imaging optical system which includes a prism that is positioned on an object side of said image sensor, wherein said prism bends an optical path of light emanating from an object to lead said light to said image sensor;
   a housing which accommodates and supports said image sensor and said prism;
   a light shield frame, comprising an integral portion of said housing, provided on the object side of an incident surface of said prism, wherein said light shield frame shields a part of said light incident on said incident surface of said prism; and
   a prism positioning surface which is provided on said housing and contacts said prism to position said prism with respect to said housing;
   said prism positioning surface comprising:
      an inclined flat surface which is in contact with a flat reflecting surface, said flat reflecting surface provided on said prism and configured to bend said optical path, wherein said inclined flat surface is inclined with respect to both an optical path of said light incident on said flat reflecting surface and an optical path of said light reflected by said flat reflecting surface; and
      an incident-side contact surface which contacts an outer edge of said incident surface of said prism and is orthogonal to said optical path of said light incident on said flat reflecting surface;
   said housing comprising a frame member which faces said incident surface of said prism, and
   said frame member comprising:
      a base portion which extends in a direction orthogonal to both said optical path of said light incident on said flat reflecting surface and said optical path of said light reflected by said flat reflecting surface and which is formed integrally with an inner surface of said housing;
      a pair of side portions which extend from both ends of said base portion in a direction parallel to said optical path of said light reflected by said flat reflecting surface; and
      a connecting portion which is parallel to said base portion and connects common ends of said pair of side portions,
      wherein said light shield frame is formed on inner edges of said base portion, said pair of side portions and said connecting portion, and
      wherein said incident-side contact portion is formed on said frame member except on said connecting portion of said frame member.

2. The imaging unit according to claim 1, wherein said imaging optical system comprises an incident-side prism which is positioned closer to said object than said prism and bends said optical path to lead said light to said prism.

3. The imaging unit according to claim 1, further comprising:
   a cover glass which covers an imaging surface of said image sensor; and
   an image-sensor positioning surface which is formed on said housing and contacts said cover glass to position said image sensor with respect to said housing.

4. The imaging unit according to claim 3, wherein a plurality of said image-sensor positioning surfaces lie on a common plane.

5. The imaging unit according to claim 4, wherein said inclined flat surface comprises a plurality of inclined flat surfaces that lie on a common plane.

6. The imaging unit according to claim 1, wherein said light shield frame is integrally provided as a portion of said housing.

7. The imaging unit according to claim 1, wherein said light shield frame is a unitary part of said housing.

8. The imaging unit according to claim 1, wherein the housing and the light shield frame are a single member.

9. An imaging unit comprising:
   an image sensor;
   an imaging optical system which includes a prism that is positioned on the object side of said image sensor, wherein said prism bends an optical path of light emanating from an object to lead said light to said image sensor;
   a housing which accommodates and supports said image sensor and said prism;
   a light shield frame, the comprises a part of said housing, provided on the object side of an incident surface of said prism, wherein said light shield frame shields a part of said light incident on said incident surface of said prism; and a prism positioning surface which is provided on said housing and contacts said prism to position said prism with respect to said housing, said prism positioning surface comprising: an inclined flat surface which is in contact with a flat reflecting surface, said flat reflecting surface provided on said prism and configured to bend said optical path, wherein said inclined flat surface is inclined with respect to both an optical path of said light incident on said flat reflecting surface and an optical path of said light reflected by said flat reflecting surface, and an incident-side contact surface which contacts an outer edge of said incident surface of said prism and is orthogonal to said optical path of said light incident on said flat reflecting surface, said housing comprising a frame member which faces said incident surface of said prism, and said frame member comprising:

a base portion which extends in a direction orthogonal to both said optical path of said light incident on said flat reflecting surface and said optical path of said light reflected by said flat reflecting surface and which is integral with an inner surface of said housing;

a pair of side portions which extend from both ends of said base portion in a direction parallel to said optical path of said light reflected by said flat reflecting surface; and a connecting portion which is parallel to said base portion and connects common ends of said pair of side portions, wherein said light shield frame is provided on inner edges of said base portion, said pair of side portions and said connecting portion, and wherein said incident-side contact portion is provided on said frame member except on said connecting portion of said frame member.

10. The imaging unit according to claim 9, wherein said imaging optical system comprises an incident-side prism which is positioned closer to said object than said prism and bends said optical path to lead said light to said prism.

11. The imaging unit according to claim 9, further comprising:

a cover glass which covers an imaging surface of said image sensor; and an image-sensor positioning surface which is provided on said housing and contacts said cover glass to position said image sensor with respect to said housing.

12. The imaging unit according to claim 11, wherein a plurality of said image-sensor positioning surfaces lie on a common plane.

13. The imaging unit according to claim 9, wherein said inclined flat surface comprises a plurality of inclined flat surfaces that lie on a common plane.

* * * * *